(12) United States Patent
Kwon et al.

(10) Patent No.: US 11,417,686 B2
(45) Date of Patent: Aug. 16, 2022

(54) DISPLAY SUBSTRATE AND DISPLAY DEVICE INCLUDING THE SAME

(71) Applicant: SAMSUNG DISPLAY CO., LTD., Yongin-si (KR)

(72) Inventors: Se Myung Kwon, Yongin-si (KR); Duk Young Kim, Hwaseong-si (KR); Young Kuk Kim, Seoul (KR); Cheol Su Kim, Seoul (KR); Yu Ri Oh, Gwangju (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 145 days.

(21) Appl. No.: 17/026,856

(22) Filed: Sep. 21, 2020

(65) Prior Publication Data

US 2021/0280613 A1  Sep. 9, 2021

(30) Foreign Application Priority Data

Mar. 6, 2020  (KR) .................. 10-2020-0028606

(51) Int. Cl.
*H01L 27/12* (2006.01)
*H01L 27/32* (2006.01)
*H01L 51/52* (2006.01)

(52) U.S. Cl.
CPC ...... *H01L 27/1222* (2013.01); *H01L 27/3258* (2013.01); *H01L 51/5206* (2013.01)

(58) Field of Classification Search
CPC ............. H01L 27/1225; H01L 29/4908; H01L 29/7869
See application file for complete search history.

(56) References Cited

U.S. PATENT DOCUMENTS

| | | | | |
|---|---|---|---|---|
| 6,331,717 B1* | 12/2001 | Takemura | ......... | H01L 29/78675 257/70 |
| 9,698,279 B2 | 7/2017 | Kim | | |
| 2010/0025676 A1* | 2/2010 | Yamazaki | ......... | H01L 29/42384 204/192.1 |
| 2013/0320317 A1* | 12/2013 | Lee | ....................... | G02F 1/1368 257/66 |
| 2017/0092198 A1* | 3/2017 | Ryu | ..................... | G09G 3/3233 |
| 2018/0151654 A1* | 5/2018 | Lee | ................... | H01L 29/41733 |
| 2020/0066765 A1 | 2/2020 | Cho et al. | | |

* cited by examiner

*Primary Examiner* — Bryan R Junge
(74) *Attorney, Agent, or Firm* — F. Chau & Associates, LLC

(57) ABSTRACT

The present disclosure relates to a display substrate. The display substrate may include a substrate, a first lower gate electrode, an insulation pattern, a first insulation layer, and a first active pattern. The first lower gate electrode may be disposed on the substrate. The insulation pattern may be disposed on and patterned to correspond to the first lower gate electrode and may include a silicon nitride. The first insulation layer may be disposed on the insulation pattern and may include a silicon oxide. The first active pattern may be on the first insulation layer and formed of oxide semiconductor and may include a first channel region overlapping the first lower gate electrode and a first wiring region disposed on a side of the first channel region.

20 Claims, 5 Drawing Sheets

DISPLAY SUBSTRATE AND DISPLAY DEVICE INCLUDING THE SAME

CROSS-REFERENCE TO RELATED APPLICATION(S)

This application claims priority under 35 USC § 119 to Korean Patent Application No. 10-2020-0028606 filed on Mar. 6, 2020 in the Korean Intellectual Property Office (KIPO), the disclosure of which is incorporated by reference herein in its entirety.

BACKGROUND

1. Field

Embodiments relate to a display device. More particularly, embodiments relate to a display substrate including a transistor and a display device including the display substrate.

2. Description of the Related Art

A display device is a device used to present information to a user through a screen. For example, a display device may use a light-emitting element to generate light for displaying an image. Electronic devices such as cell phones, tablet computers, or navigation devices contain display devices. In some cases, a display device includes a display substrate with a transistor to provide current, voltage, etc. to drive the light-emitting element.

Fluorine may be used to alter characteristics of a transistor of a display device based on the location of the fluorine. Controlling regions where fluorine flows may enhance the overall display device properties. Therefore, it may be desirable to allow, or to not allow, a free flow of fluorine to move into certain regions.

However, complex transistor designs lead to poor transistor characteristics and lesser display device properties. Therefore, there is a need in the art for a transistor design to simplify a flow of fluorine throughout the transistor.

SUMMARY

Embodiments provide a display substrate including a transistor with increased characteristics and a display device including the display substrate.

A display substrate according to an embodiment may include a substrate, a first lower gate electrode disposed on the substrate, an insulation pattern disposed on and patterned to correspond to the first lower gate electrode, the insulation pattern including silicon nitride, a first insulation layer disposed on the insulation pattern, the first insulation layer including silicon oxide, and a first active pattern disposed on the first insulation layer and comprising an oxide semiconductor, the first active pattern including a first channel region overlapping the first lower gate electrode and a first wiring region disposed on a side of the first channel region.

In an embodiment, the insulation pattern may be disposed directly on the first lower gate electrode. In an embodiment, a width of the first lower gate electrode may be greater than or substantially equal to a width of the first channel region. In an embodiment, a value obtained by subtracting the width of the first channel region from the width of the first lower gate electrode may be greater than or equal to about 1.6 µm.

In an embodiment, a width of the insulation pattern may be greater than or substantially equal to a width of the first lower gate electrode. In an embodiment, a value obtained by subtracting the width of the first lower gate electrode from the width of the insulation pattern may be greater than or substantially equal to about 1.6 µm. In an embodiment, a width of the insulation pattern may be less than a width of the first active pattern. In an embodiment, a thickness of the insulation pattern may be in a range from about 300 Å to about 3000 Å.

In an embodiment, a fluorine (F) concentration of the first wiring region may be greater than a fluorine concentration of the first channel region. In an embodiment, the fluorine concentration of the first wiring region may be more than twice the fluorine concentration of the first channel region.

In an embodiment, the display substrate may further include a second insulation layer disposed on the first active pattern and a first upper gate electrode disposed on the second insulation layer, the first upper gate electrode overlapping the first channel region.

In an embodiment, the display substrate may further include a second active pattern disposed on the substrate, the second active pattern not overlapping the first active pattern and including a second channel region and a second wiring region disposed on a side of the second channel region, a second insulation layer disposed on the second active pattern, and a second gate electrode disposed on the second insulation layer, the second gate electrode overlapping the second channel region.

In an embodiment, the second active pattern may be formed of polycrystalline silicon. In an embodiment, the display substrate may further include a third insulation layer disposed on the second gate electrode and a capacitor electrode disposed on the third insulation layer, the capacitor electrode overlapping the second gate electrode. In an embodiment, the capacitor electrode may be disposed on the same layer as the first lower gate electrode.

A display device according to an embodiment may include a substrate, a first transistor disposed on the substrate, and a light-emitting element disposed on the first transistor. The first transistor may include a first lower gate electrode, an insulation pattern disposed on and patterned to correspond to the first lower gate electrode, the insulation pattern including silicon nitride, a first insulation layer disposed on the insulation pattern, the first insulation layer including silicon oxide, and a first active pattern disposed on the first insulation layer and formed of oxide semiconductor, the first active pattern including a first channel region overlapping the first lower gate electrode and a first wiring region disposed on a side of the first channel region.

In an embodiment, the display device may further include a second transistor disposed between the substrate and the light-emitting element, the second transistor not overlapping the first transistor. The second transistor may include a second active pattern including a second channel region and a second wiring region disposed on a side of the second channel region, a second insulation layer disposed on the second active pattern, and a second gate electrode disposed on the second insulation layer, the second gate electrode overlapping the second channel region.

In an embodiment, the second active pattern may be formed of polycrystalline silicon. In an embodiment, the display device may further include a capacitor disposed between the second transistor and the light-emitting element. The capacitor may include the second gate electrode, a third insulation layer disposed on the second gate electrode, and a capacitor electrode disposed on the third insulation layer, the capacitor electrode overlapping the second gate electrode. In an embodiment, the capacitor electrode may be disposed on the same layer as the first lower gate electrode.

In the display substrate and the display device including the display substrate according to the embodiments, the insulation pattern, which is patterned to correspond to the first lower gate electrode and including silicon nitride, may be disposed between the first lower gate electrode and the first channel region of the first active pattern, so that fluorine may not flow into the first channel region of the first active pattern from the first lower gate electrode, and the first channel region may not become conductive. Further, fluorine may flow into the first wiring region of the first active pattern from the first lower gate electrode, and the resistance of the first wiring region may decrease. Accordingly, characteristics of the transistor included in the display substrate may be increased.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

The present disclosure relates generally to a display device. More particularly, embodiments of the present disclosure relate to a display substrate of a transistor in a display device. For example, some embodiments provide a means to control locations where fluorine flows to inside the transistor.

Fluorine flow may impact the functioning of the transistor. For example, fluorine can be used to passivate trap states in a transistor. Accordingly, fluorine (or another material having a similar effect on an active region of the transistor) may flow into a channel region, and not into a wiring region, may impede performance. By contrast, directing flow to the wiring region and not to the channel region may increase the performance characteristics of the transistor and improve properties of the display device.

For example, embodiments of the present disclosure provide an insulation pattern including silicon nitride that is patterned to correspond to a lower gate electrode, and disposed between the lower gate electrode and an active pattern. Accordingly, fluorine may be prevented from flowing into the channel region of the active pattern from the lower gate electrode, but may be encouraged to flow into the wiring region of the active pattern from the lower gate electrode.

In an one embodiment, a display substrate may include a substrate, a first lower gate electrode, an insulation pattern, a first insulation layer, and a first active pattern. The first lower gate electrode may be disposed on the substrate. The insulation pattern may be disposed on and patterned to correspond to the first lower gate electrode and may include a silicon nitride. The first insulation layer may be disposed on the insulation pattern and may include a silicon oxide. The first active pattern may be on the first insulation layer and formed of oxide semiconductor and may include a first channel region overlapping the first lower gate electrode and a first wiring region disposed on a side of the first channel region.

Hereinafter, display substrates and display devices in accordance with embodiments will be explained in detail with reference to the accompanying drawings. For example, a display substrate, according to an embodiment, will be described with reference to FIGS. 1 and 2.

Figure 1:
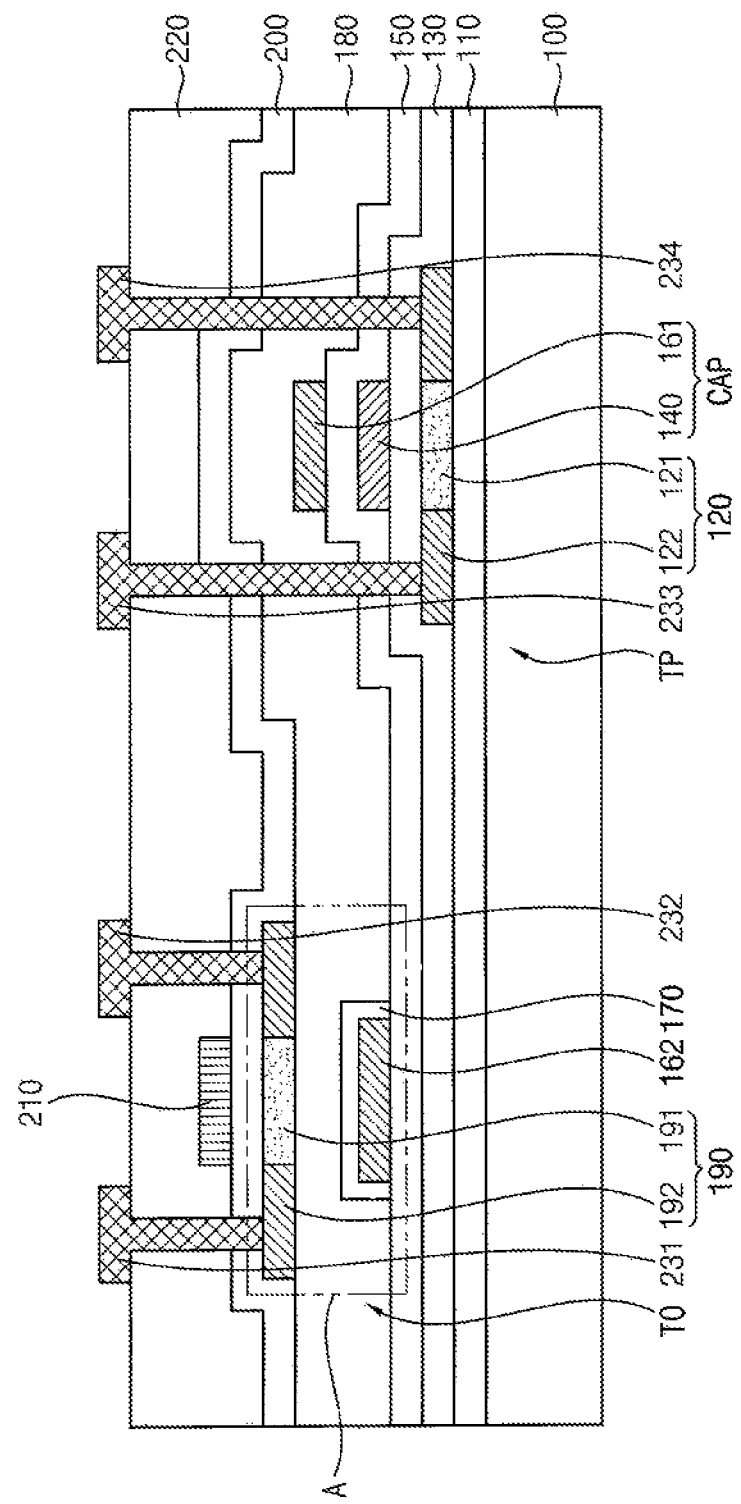
FIG. 1 is a cross-sectional view illustrating a display substrate according to an embodiment.

FIG. 1 is a cross-sectional view illustrating a display substrate according to an embodiment.

Referring to FIG. 1, a display substrate according to an embodiment may include a substrate 100, a buffer layer 110, a second active pattern 120, a first gate insulation layer 130, a second gate electrode 140, a second gate insulation layer 150, a capacitor electrode 161, a first lower gate electrode 162, an insulation pattern 170, a first insulation interlayer 180, a first active pattern 190, a third gate insulation layer 200, a first upper gate electrode 210, a second insulation interlayer 220, a first source electrode 231, a first drain electrode 232, a second source electrode 233, and a second drain electrode 234.

The substrate 100 may be an insulating substrate including glass, quartz, plastic, or the like. In an embodiment, the substrate 100 may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulation material such as polyimide (PI) or the like. The first barrier layer and the second barrier layer may include an inorganic insulation material such as silicon oxide, silicon nitride, amorphous silicon, or the like.

The buffer layer 110 may be disposed on the substrate 100. The buffer layer 110 may block impurities from being permeated toward above the substrate 100 through the substrate 100. Further, the buffer layer 110 may provide a planarized upper surface above the substrate 100. The buffer layer 110 may include an inorganic insulation material such as silicon oxide, silicon nitride, silicon oxynitride, or the like.

The second active pattern 120 may be disposed on the buffer layer 110. The second active pattern 120 may include a second channel region 121 and a second wiring region 122 disposed on a side of the second channel region 121. For example, the second wiring region 122 may be disposed on opposite sides of the second channel region 121.

The second wiring region 122 may be doped with P-type or N-type impurities. The second channel region 121 may be doped with impurities of an opposite type to the impurities doped in the second wiring region 122. For example, the second wiring region 122 may be doped with P-type impurities and the second channel region 121 may be doped with N-type impurities.

In an embodiment, the second active pattern 120 may be formed of polycrystalline silicon. However, the present invention is not limited thereto, and in another embodiment, the second active pattern 120 may be formed of amorphous silicon, an oxide semiconductor, or the like.

The first gate insulation layer 130 may be disposed on the second active pattern 120. The first gate insulation layer 130 may cover the second active pattern 120 and may be disposed on the buffer layer 110. The first gate insulation layer 130 may insulate the second gate electrode 140 disposed on the second active pattern 120 from the second active pattern 120. The first gate insulation layer 130 may include an inorganic insulation material such as silicon oxide, silicon nitride, silicon oxynitride, or the like.

A gate electrode refers to an electrical conductor that controls the flow of current between a source and a drain of a transistor. The second gate electrode 140 may be disposed on the first gate insulation layer 130. The second gate electrode 140 may overlap the second channel region 121 of the second active pattern 120. The second gate electrode 140 may include a conductive material such as molybdenum (Mo), copper (Cu), or the like. The second active pattern 120, the first gate insulation layer 130, and the second gate electrode 140 may form a second transistor TP.

A second gate insulation layer 150 may be disposed on the second gate electrode 140. The second gate insulation layer 150 may cover the second gate electrode 140 and may be disposed on the first gate insulation layer 130. The second gate insulation layer 150 may insulate a capacitor electrode 161 disposed on the second gate electrode 140 from the second gate electrode 140. The second gate insulation layer 150 may include an inorganic insulation material such as silicon oxide, silicon nitride, silicon oxynitride, or the like.

The capacitor electrode 161 and the first lower gate electrode 162 may be disposed on the second gate insulation layer 150. The capacitor electrode 161 may overlap the second gate electrode 140. The first lower gate electrode 162 may be disposed on the same layer as the capacitor electrode 161 and may be spaced apart from the capacitor electrode 161. The first lower gate electrode 162 may not overlap the second active pattern 120 and the second gate electrode 140. The capacitor electrode 161 and the first lower gate electrode 162 may include a conductive material such as molybdenum (Mo), copper (Cu), or the like. The second gate electrode 140, the second gate insulation layer 150, and the capacitor electrode 161 may form a capacitor CAP.

The insulation pattern 170 may be disposed on the first lower gate electrode 162. The insulation pattern 170 may be patterned to correspond to the first lower gate electrode 162. For example, the insulation pattern 170 may have a same or similar shape to a shape of the first lower gate electrode 162 in a plan view. The insulation pattern 170 may include silicon nitride. The insulation pattern 170 may overlap the first lower gate electrode 162. In other words, the insulation pattern 170 may not be disposed on the capacitor electrode 161, and may not overlap the capacitor electrode 161.

In an embodiment, the insulation pattern 170 may be disposed directly on the first lower gate electrode 162. In other words, a lower surface of the insulation pattern 170 may contact an upper surface of the first lower gate electrode 162.

The first insulation interlayer 180 may be disposed on the capacitor electrode 161 and the insulation pattern 170. The first insulation interlayer 180 may cover the capacitor electrode 161 and the insulation pattern 170 and may be disposed on the second gate insulation layer 150. The first insulation interlayer 180 may include silicon oxide. In an embodiment, a thickness of the first insulation interlayer 180 may be about 3000 Å.

The first active pattern 190 may be disposed on the first insulation interlayer 180. The first active pattern 190 may include a first channel region 191 overlapping the first lower gate electrode 162 and a first wiring region 192 disposed on a side of the first channel region 191. For example, the first wiring region 192 may be disposed on opposite sides of the first channel region 191. The first active pattern 190 may not overlap the capacitor electrode 161. Accordingly, the first active pattern 190 may not overlap the second gate electrode 140 and the second active pattern 120.

The first wiring region 192 may be doped with P-type or N-type impurities. The first channel region 191 may be doped with impurities of an opposite type to the impurities doped in the first wiring region 192. For example, the first wiring region 192 may be doped with N-type impurities, and the first channel region 191 may be doped with P-type impurities.

In an embodiment, the first active pattern 190 may be formed of an oxide semiconductor. For example, the oxide semiconductor may include indium gallium zinc oxide (IGZO), zinc tin oxide (ZTO), indium zinc oxide (IZO), or the like.

The third gate insulation layer 200 may be disposed on the first active pattern 190. The third gate insulation layer 200 may cover the first active pattern 190, and may be disposed on the first insulation interlayer 180. The third gate insulation layer 200 may insulate the first upper gate electrode 210 disposed on the first active pattern 190 from the first active pattern 190. The third gate insulation layer 200 may include an inorganic insulation material such as silicon oxide, silicon nitride, silicon oxynitride, or the like.

The first upper gate electrode 210 may be disposed on the third gate insulation layer 200. The first upper gate electrode 210 may overlap the first channel region 191 of the first active pattern 190. The first upper gate electrode 210 may include a conductive material such as molybdenum (Mo), copper (Cu), or the like. The first lower gate electrode 162, the insulation pattern 170, the first insulation interlayer 180, the first active pattern 190, the third gate insulation layer 200, and the first upper gate electrode 210 may form a first transistor TO.

The second insulation interlayer 220 may be disposed on the first upper gate electrode 210. The second insulation interlayer 220 may cover the first upper gate electrode 210, and may be disposed on the third gate insulation layer 200. The second insulation interlayer 220 may insulate the first source electrode 231 and the first drain electrode 232 disposed on the first upper gate electrode 210 from the first upper gate electrode 210. The second insulation interlayer 220 may include an inorganic insulation material such as silicon oxide, silicon nitride, silicon oxynitride, or the like and/or an organic insulation material such as polyimide (PI) or the like.

The first source electrode 231, the first drain electrode 232, the second source electrode 233, and the second drain electrode 234 may be disposed on the second insulation interlayer 220. The first source electrode 231 and the first drain electrode 232 may be electrically connected to the first wiring region 192 of the first active pattern 190. For example, the first source electrode 231 may contact the first wiring region 192 disposed on one side of the first channel region 191 through a contact hole formed in the third gate insulation layer 200 and the second insulation interlayer 220. Additionally or alternatively, the first drain electrode 232 may contact the first wiring region 192 disposed on another side of the first channel region 191 through a contact hole formed in the third gate insulation layer 200 and the second insulation interlayer 220.

The second source electrode 233 and the second drain electrode 234 may be electrically connected to the second wiring region 122 of the second active pattern 120. For example, the second source electrode 233 may contact the second wiring region 122 disposed on one side of the second channel region 121 through a contact hole formed in the first gate insulation layer 130, the second gate insulation layer 150, the first insulation interlayer 180, the third gate insulation layer 200, and the second insulation interlayer 220. Additionally or alternatively, the second drain electrode 234 may contact the second wiring region 122 disposed on another side of the second channel region 121 through a contact hole formed in the first gate insulation layer 130, the second gate insulation layer 150, the first insulation interlayer 180, the third gate insulation layer 200, and the second insulation interlayer 220. The first source electrode 231, the first drain electrode 232, the second source electrode 233, and the second drain electrode 234 may include a conductive material such as aluminum (Al), titanium (Ti), copper (Cu), or the like.

Accordingly, in an embodiment of the present disclosure, a display device may include a substrate 100, a first lower gate electrode 162 disposed on the substrate 100, an insulation pattern 170 disposed on the first lower gate electrode 162, a first insulation interlayer 180 disposed on the insulation pattern 170, and a first active pattern 190 disposed on the first insulation layer. The first active pattern 190 may include a first channel region 191 overlapping the first lower gate electrode 162 and a first wiring region 192 disposed on at least one side of the first channel region 191 in a plan view. In some cases, the first wiring region 192 is disposed on two opposite sides of the first channel region 191 in a plan view. The insulation pattern 170 may be configured to prevent fluorine from flowing into the first channel region 191 from the first lower gate electrode 162 so that a concentration of fluorine in the first channel region 191 is less than a concentration of fluorine in the first wiring region 192.

Figure 2:
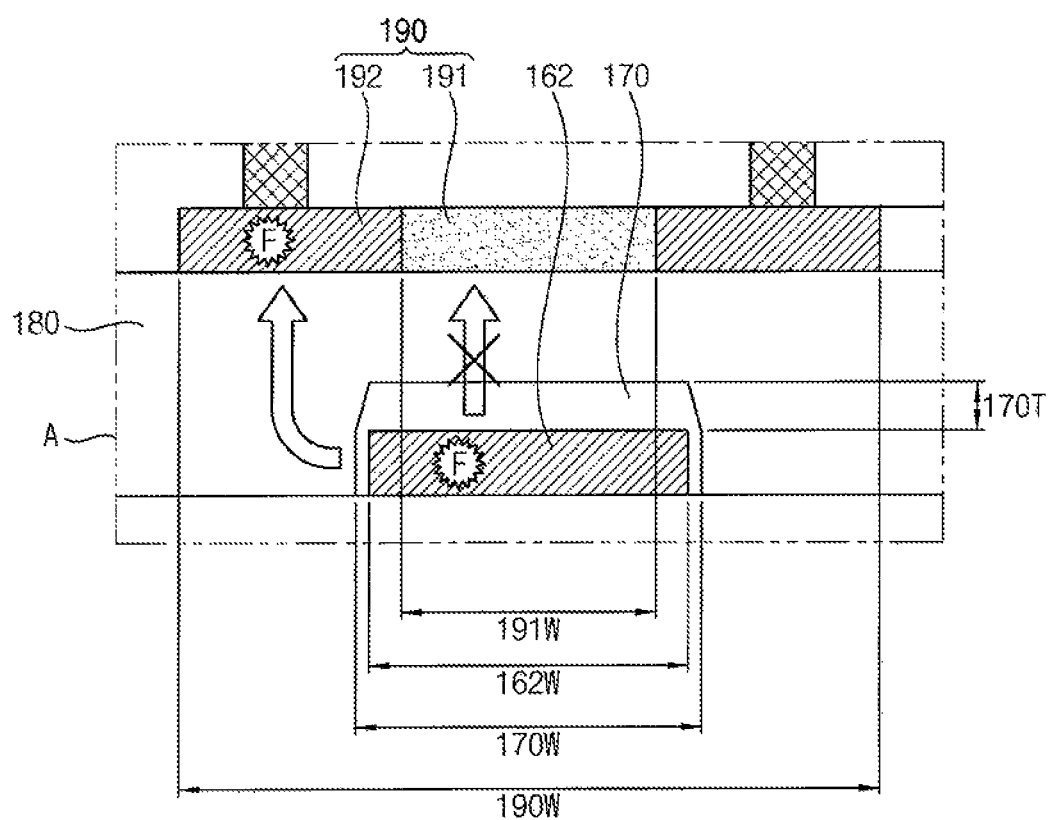
FIG. 2 is a cross-sectional view illustrating an area A in FIG. 1.

FIG. 2 is a cross-sectional view illustrating an area A in FIG. 1.

Referring to FIGS. 1 and 2, a width 162W of the first lower gate electrode 162 may be greater than or substantially equal to a width 191W of the first channel region 191. In one embodiment, the width 162W of the first lower gate electrode 162 is equal to the width 191W of the first channel region 191 The width 162W of the first lower gate electrode 162 may be greater than or substantially equal to the width 191W of the first channel region 191 in consideration of tolerance generated in the formation of the first active pattern 190 on the first lower gate electrode 162.

In an embodiment, a value obtained by subtracting the width 191W of the first channel region 191 from the width 162W of the first lower gate electrode 162 may be greater than or equal to about 1.6 µm. One-sided tolerance of about 0.8 µm may be generated in the forming the first active pattern 190 on the first lower gate electrode 162. Here, the one-sided tolerance may be a difference between a position of a side of the first channel region 191 and an actual position of the side of the first channel region 191. The width 162W of the first lower gate electrode 162 may be greater than or equal to about 1.6 µm of the width 191W of the first channel region 191 in consideration of the one-sided tolerance.

A width 170W of the insulation pattern 170 may be greater than or substantially equal to the width 162W of the first lower gate electrode 162. In one embodiment, the width 170W of the insulation pattern 170 is equal to the width 162W of the first lower gate electrode 162, however, the width 170W of the insulation pattern 170 may be greater than or substantially equal to the width 162W of the first lower gate electrode 162 in consideration of tolerance generated in the formation of the insulation pattern 170 on the first lower gate electrode 162.

In an embodiment, a value obtained by subtracting the width 162W of the first lower gate electrode 162 from the width 170W of the insulation pattern 170 may be greater than or equal to about 1.6 µm. One-sided tolerance of about 0.8 µm may be generated in the forming the insulation pattern 170 on the first lower gate electrode 162. Here, the one-sided tolerance may be a difference between a position of a side of the insulation pattern 170 and an actual position of the side of the insulation pattern 170. The width 170W of the insulation pattern 170 may be greater than or equal to about 1.6 µm of the width 162W of the first lower gate electrode 162 in consideration of the one-sided tolerance.

Accordingly, a fluorine (F) concentration of the first wiring region 192 may be greater than a fluorine concentration of the first channel region 191. In an embodiment, the fluorine (F) concentration of the first wiring region 192 may be more than twice the fluorine concentration of the first channel region 191. Since the insulation pattern 170 including silicon nitride with a relatively large amount of hydrogen is disposed on the first lower gate electrode 162 and patterned to correspond to the first lower gate electrode 162, the insulation pattern 170 may block fluorine (F) from flowing into the first channel region 191 from the first lower gate electrode 162. Accordingly, the first channel region 191 may be prevented from having conductivity due to inflow of fluorine (F).

In some cases, fluorine (F) may flow into the first wiring region 192 from the first lower gate electrode 162 through the first insulation interlayer 180. For example, the first insulation interlayer 180 may include silicon oxide and a relatively small amount of hydrogen may be disposed on a side of the first lower gate electrode 162, and the insulation pattern 170 may not be disposed between the side of the first lower gate electrode 162 and the first insulation interlayer 180. Additionally or alternatively, a width of the insulation pattern 170 disposed between the side of the first lower gate electrode 162 and the first insulation interlayer 180 may be relatively small. A resistance of the first wiring region 192 may decrease when fluorine (F) flows into the first wiring region 192. Therefore, on-current of the first transistor TO may increase. In an example scenario, the on-current is a current flowing through a switch when the switch is on.

A thickness 170T of the insulation pattern 170 may be in a range from about 300 Å to about 3000 Å. The insulation pattern 170 may not block fluorine (F) from flowing into first channel region 191 from the first lower gate electrode 162 when the thickness 170T of the insulation pattern 170 is less than about 300 Å. Further, a large step may be generated in the first insulation interlayer 180 disposed on the insulation pattern 170 when the thickness 170T of the insulation pattern 170 is greater than about 3000 Å. Therefore, if the thickness 170T of the insulation pattern 170 is outside the range from about 300 Å to about 3000 Å, performance characteristics of the first active pattern 190 disposed on the first insulation interlayer 180 may be reduced.

The width 170W of the insulation pattern 170 may be less than a width 190W of the first active pattern 190. The width 170W of the insulation pattern 170 disposed between the side of the first lower gate electrode 162 and the first insulation interlayer 180 may be relatively large when the width 170W of the insulation pattern 170 is greater than the width 190W of the first active pattern 190. As a result, fluorine (F) may not flow into the first wiring region 192 from the first lower gate electrode 162 through the first insulation interlayer 180. Accordingly, the width 170W of the insulation pattern 170 may be less than the width 190W of the first active pattern 190 such that fluorine (F) flows into the first wiring region 192 from the first lower gate electrode 162 through the first insulation interlayer 180.

Hereinafter, a display device, according to an embodiment, will be described with reference to FIGS. 3, 4, and 5.

Figure 3:
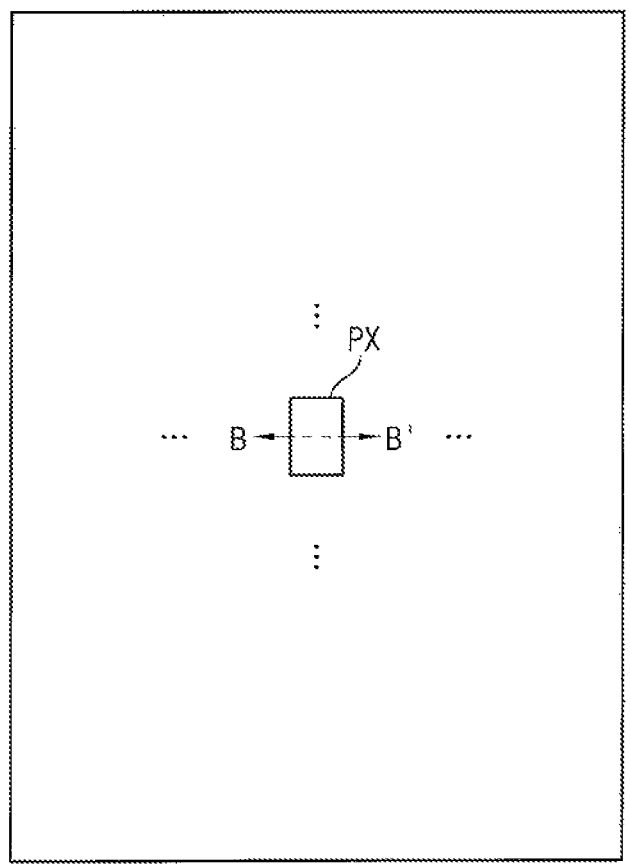
FIG. 3 is a plan view illustrating a display device according to an embodiment.

FIG. 3 is a plan view illustrating a display device according to an embodiment.

Referring to FIG. 3, a display device, according to an embodiment, may include a plurality of pixels PX. Each of the pixels PX may emit light, and the display device may display an image formed by the light emitted from each of the pixels PX. The pixels PX may be arranged along a row direction and a column direction as a substantial matrix form.

Figure 4:
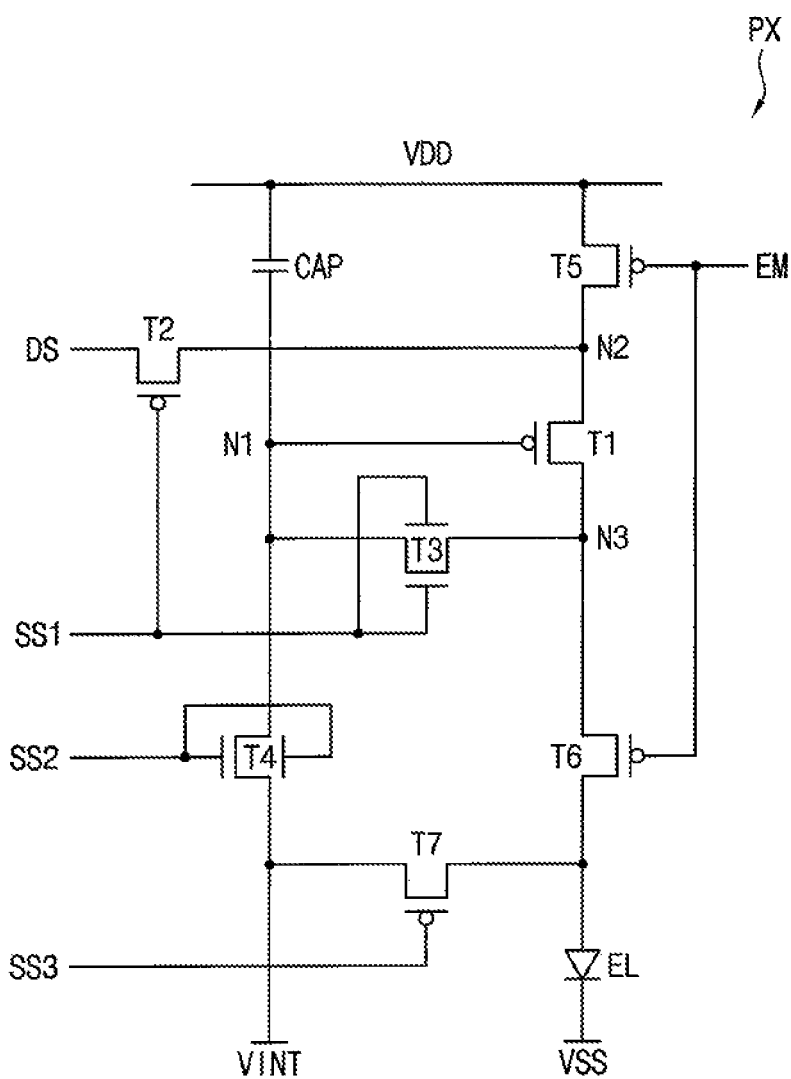
FIG. 4 is a circuit diagram illustrating a pixel of the display device in FIG. 3.

FIG. 4 is a circuit diagram illustrating the pixel PX of the display device in FIG. 3.

Referring to FIG. 4, the pixel PX may include a pixel circuit and a light-emitting element EL connected to the pixel circuit. The pixel circuit may provide a driving current to the light-emitting element EL. The light-emitting element EL may emit light based on the driving current provided from the pixel circuit. The pixel circuit may include at least one transistor and at least one capacitor to generate the driving current.

In an embodiment, the pixel circuit may include a driving transistor T1, a switching transistor T2, a compensation transistor T3, a first initialization transistor T4, a first emission control transistor T5, a second emission control transistor T6, a second initialization transistor T7, and a capacitor CAP. However, the present invention is not limited thereto, and in another embodiment, the pixel circuit may include two to six or eight or more transistors and/or two or more capacitors.

A gate electrode of the driving transistor T1 may be connected to a first node N1. A source electrode of the driving transistor T1 may be connected to a second node N2. A drain electrode of the driving transistor T1 may be connected to a third node N3. The driving transistor T1 may generate the driving current based on a voltage between the gate electrode and the source electrode.

A first scan signal SS1 may be applied to a gate electrode of the switching transistor T2. A data signal DS may be applied to a source electrode of the switching transistor T2. A drain electrode of the switching transistor T2 may be connected to the second node N2. The switching transistor T2 may transmit the data signal DS to the second node N2 based on the first scan signal SS1.

The first scan signal SS1 may be applied to a gate electrode of the compensation transistor T3. A source electrode of the compensation transistor T3 may be connected to the first node N1, and a drain electrode of the compensation transistor T3 may be connected to the third node N3. The compensation transistor T3 may connect the gate electrode and the drain electrode of the driving transistor T1 based on the first scan signal SS1 to compensate for a threshold voltage of the driving transistor T1.

A second scan signal SS2 may be applied to a gate electrode of the first initialization transistor T4. In an embodiment, the second scan signal SS2 may be a first scan signal applied to an (N−1)-th pixel row when the pixel PX is included in an N-th pixel row. An initialization voltage VINT may be applied to a source electrode of the first initialization transistor T4. A drain electrode of the first initialization transistor T4 may be connected to the first node N1. The first initialization transistor T4 may transmit the initialization voltage VINT to the first node N1 based on the second scan signal SS2 to initialize the gate electrode of the driving transistor T1.

An emission control signal EM may be applied to a gate electrode of the first emission control transistor T5. A first power voltage VDD may be applied to a source electrode of the first emission control transistor T5. A drain electrode of the first emission control transistor T5 may be connected to the second node N2.

The emission control signal EM may be applied to a gate electrode of the second emission control transistor T6. A source electrode of the second emission control transistor T6 may be connected to the third node N3. A drain electrode of the second emission control transistor T6 may be connected to the light-emitting element EL. The first emission control transistor T5 and the second emission control transistor T6 may transmit the driving current generated from the driving transistor T1 to the light-emitting element EL based on the emission control signal EM.

A third scan signal SS3 may be applied to a gate electrode of the second initialization transistor T7. In an embodiment, the third scan signal SS3 may be a first scan signal applied to an (N+1)-th pixel row when the pixel PX is included in the N-th pixel row. The initialization voltage VINT may be applied to a source electrode of the second initialization transistor T7, and a drain electrode of the second initialization transistor T7 may be connected to the light-emitting element EL. The second initialization transistor T7 may transmit the initialization voltage VINT to the light-emitting element EL based on the third scan signal SS3 to initialize the light-emitting element EL.

In an embodiment, each of the driving transistor T1, the switching transistor T2, the first emission control transistor T5, the second emission control transistor T6, and the second initialization transistor T7 may be a transistor with a single gate structure. Each of the compensation transistor T3 and the first initialization transistor T4 may be a transistor with a double gate structure. In such an embodiment, the gate electrode of each of the compensation transistor T3 and the first initialization transistor T4 may include a lower gate electrode and an upper gate electrode, and the lower gate electrode and the upper gate electrode may be electrically connected.

In an embodiment, an active pattern of each of the driving transistor T1, the switching transistor T2, the first emission control transistor T5, the second emission control transistor T6, and the second initialization transistor T7 may be formed of polycrystalline silicon. Additionally or alternatively, an active pattern of each of the compensation transistor T3 and the first initialization transistor T4 may be formed of an oxide semiconductor.

In an embodiment, each of the driving transistor T1, the switching transistor T2, the first emission control transistor T5, the second emission control transistor T6, and the second initialization transistor T7 may be a p-type metal-oxide-semiconductor (PMOS). Each of the compensation transistor T3 and the first initialization transistor T4 may be an n-type metal-oxide-semiconductor (NMOS). However, the present invention is not limited thereto. In another embodiment, each of the driving transistor T1, the switching transistor T2, the first emission control transistor T5, the second emission control transistor T6, and the second initialization transistor T7 may be the NMOS or a complementary metal-oxide-semiconductor (CMOS). Additionally or alternatively, each of the compensation transistor T3 and the first initialization transistor T4 may be the PMOS or the CMOS.

The first power voltage VDD may be applied to a first electrode of the capacitor CAP, and a second electrode of the capacitor CAP may be connected to the first node N1. The capacitor CAP may maintain the voltage between the gate electrode and the source electrode of the driving transistor T1 when the switching transistor T2 is turned off, so that the light-emitting element EL may emit light.

A first electrode of the light-emitting element EL may be connected to the pixel circuit, and a second power voltage VSS may be applied to a second electrode of the light-emitting element EL. In an embodiment, the second power voltage VSS may be less than the first power voltage VDD. The light-emitting element EL may emit light based on the driving current transmitted from the pixel circuit.

Figure 5:
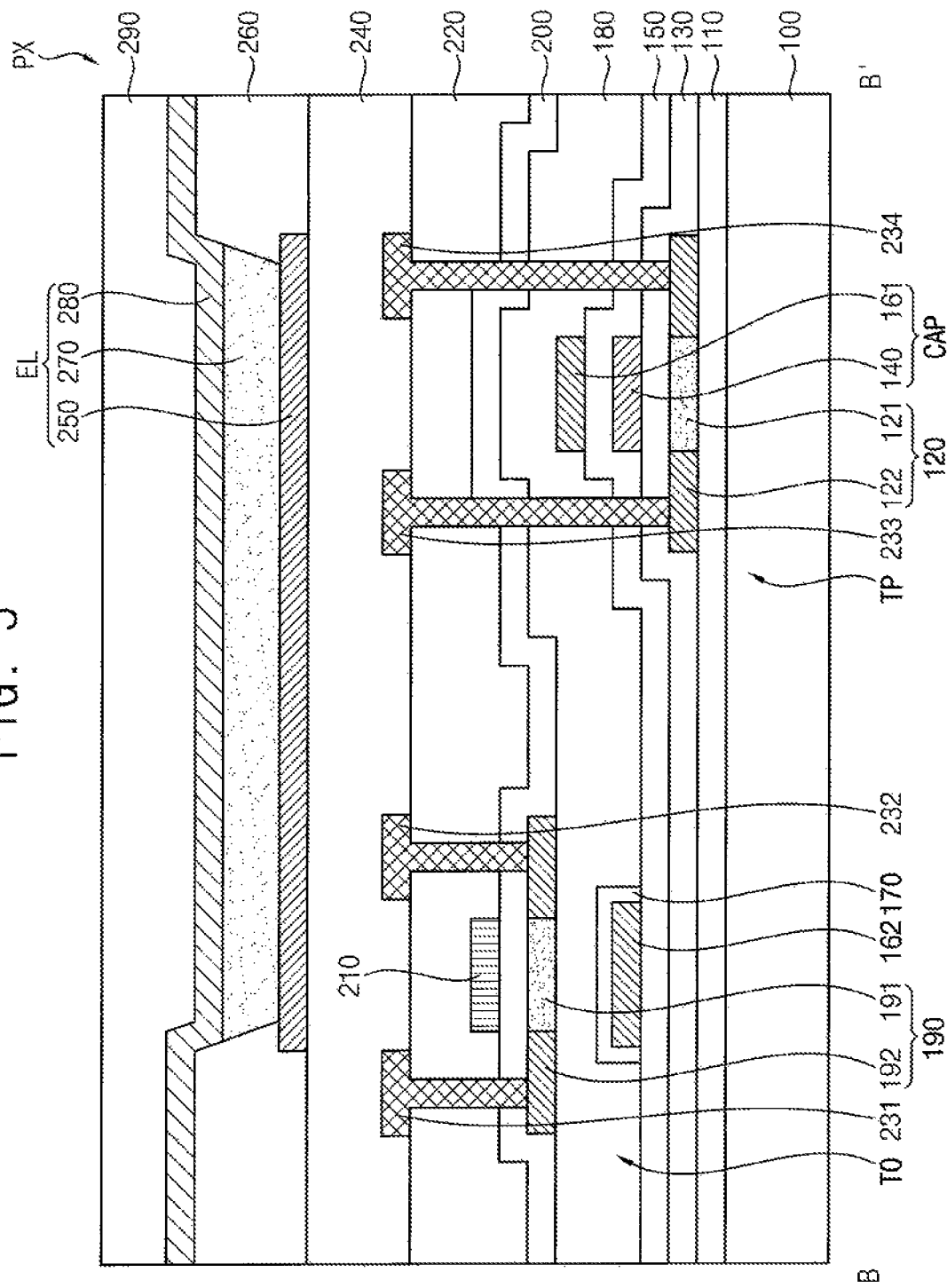
FIG. 5 is a cross-sectional view taken along a line B-B' in FIG. 3.

FIG. 5 is a cross-sectional view taken along a line B-B' in FIG. 3.

Referring to FIG. 5, a display device according to an embodiment may include a first transistor TO, a second transistor TP, a capacitor CAP, a light-emitting element EL, and an encapsulation layer 290. The first transistor TO, the second transistor TP, the capacitor CAP, the light-emitting element EL, and the encapsulation layer 290 may be disposed on a substrate 100. The display device described with reference to FIG. 5 may include the display substrate described with reference to FIGS. 1 and 2. Accordingly, descriptions on elements of the display device described with reference to FIG. 5, which are substantially the same as or similar to those of the display substrate described with reference to FIGS. 1 and 2, will not be repeated.

In an embodiment, the first transistor TO may be any one of the compensation transistor T3 and the first initialization transistor T4 in FIG. 4, and the second transistor TP may be any one of the driving transistor T1, the switching transistor T2, the first emission control transistor T5, the second emission control transistor T6, and the second initialization transistor T7 in FIG. 4.

A via insulation layer 240 may be disposed on the first source electrode 231, the first drain electrode 232, the second source electrode 233, and the second drain electrode 234. The via insulation layer 240 may cover the first source electrode 231, the first drain electrode 232, the second source electrode 233, and the second drain electrode 234, and may be disposed on the second insulation interlayer 220. The via insulation layer 240 may provide a planarized surface above the first transistor TO, the second transistor TP, and the capacitor CAP. The via insulation layer 240 may include an inorganic insulation material such as silicon oxide, silicon nitride, silicon oxynitride, or the like and/or an organic insulation material such as polyimide (PI) or the like.

A first electrode 250 may be disposed on the via insulation layer 240. The first electrode 250 may include a conductive material such as metal, alloy, transparent conductive oxide, or the like. For example, the first electrode 250 may include silver (Ag), indium tin oxide (ITO), or the like.

A pixel defining layer 260 may be disposed on and may cover the first electrode 250. The pixel defining layer 260 may be disposed on the via insulation layer 240. The pixel defining layer 260 may have a pixel opening that exposes at least a portion of the first electrode 250. In an embodiment, the pixel opening may expose a central portion of the first electrode 250, and the pixel defining layer 260 may cover a peripheral portion of the first electrode 250. The pixel defining layer 260 may include an organic insulation material such as polyimide (PI) or the like.

An emission layer 270 may be disposed on the first electrode 250 and the first electrode 250 may be exposed by the pixel opening. The emission layer 270 may include at least one of an organic light-emitting material and a quantum dot.

In an embodiment, the organic light-emitting material may include a low molecular organic compound or a high molecular organic compound. For example, the low molecular organic compound may include copper phthalocyanine, diphenylbenzidine (N,N'-diphenylbenzidine), trihydroxyquinoline aluminum (tris-(8-hydroxyquinoline)aluminum), and the like. The high molecular organic compound may include poly ethylenedioxythiophene (poly(3,4-ethylenedioxythiophene), polyaniline, polyphenylenevinylene, polyfluorene, and the like.

In an embodiment, the quantum dot may include a core including a group II-VI compound, a group III-V compound, a group IV-VI compound, a group IV element, a group IV compound, and a combination thereof. In one embodiment, the quantum dot can have a core-shell structure with a core and a shell surrounding the core. The shell may prevent chemical denaturation of the core. Therefore, the shell may be a protective layer for maintaining semiconductor characteristics and a charging layer for imparting electrophoretic characteristics to the quantum dot.

A second electrode 280 may be disposed on the emission layer 270. In an embodiment, the second electrode 280 may also be disposed on the pixel defining layer 260. The second electrode 280 may include a conductive material such as metal, alloy, transparent conductive oxide, or the like. For example, the second electrode 280 may include aluminum (Al), platinum (Pt), silver (Ag), magnesium (Mg), gold (Au), chromium (Cr), tungsten (W), titanium (Ti), or the like. The first electrode 250, the emission layer 270, and the second electrode 280 may form the light-emitting element EL.

An encapsulation layer 290 may be disposed on the second electrode 280. The encapsulation layer 290 may cover the light-emitting element EL to protect the light-emitting element EL from impurities such as oxygen, moisture, or the like. The encapsulation layer 290 may include at least one inorganic encapsulation layer and at least one organic encapsulation layer. In an embodiment, the encapsulation layer 290 may include a first inorganic encapsulation layer disposed on the second electrode 280, an organic encapsulation layer disposed on the first inorganic encapsulation layer, and a second inorganic encapsulation layer disposed on the organic encapsulation layer. The inorganic encapsulation layer may include silicon nitride, silicon oxynitride or the like, and the organic encapsulation layer may include epoxy-based resin, acryl-based resin, polyimide-based resin or the like.

The display substrate according to the embodiments may be applied to a display device included in a computer, a notebook, a mobile phone, a smartphone, a smart pad, a PMP, a PDA, an MP3 player, or the like.

Although the display substrate and the display devices according to the embodiments have been described with reference to the drawings, the illustrated embodiments are examples, and may be modified and changed by a person with ordinary knowledge in the relevant technical field without departing from the technical spirit described in the following claims.

What is claimed is:

1. A display substrate, comprising:
 a substrate;
 a first lower gate electrode disposed on the substrate;
 an insulation pattern disposed on and patterned to correspond to the first lower gate electrode, the insulation pattern including silicon nitride;
 a first insulation layer disposed on the insulation pattern, the first insulation layer including silicon oxide; and a first active pattern disposed on the first insulation layer and comprising an oxide semiconductor, the first active pattern including a first channel region overlapping the first lower gate electrode and a first wiring region disposed on a side of the first channel region.

2. The display substrate of claim 1, wherein the insulation pattern is disposed directly on the first lower gate electrode.

3. The display substrate of claim 1, wherein a width of the first lower gate electrode is greater than or equal to a width of the first channel region.

4. The display substrate of claim 3, wherein a value obtained by subtracting the width of the first channel region from the width of the first lower gate electrode is greater than or equal to 1.6 μm.

5. The display substrate of claim 1, wherein a width of the insulation pattern is greater than or equal to a width of the first lower gate electrode.

6. The display substrate of claim 5, wherein a value obtained by subtracting the width of the first lower gate electrode from the width of the insulation pattern is greater than or equal to 1.6 μm.

7. The display substrate of claim 1, wherein a width of the insulation pattern is less than a width of the first active pattern.

8. The display substrate of claim 1, wherein a thickness of the insulation pattern is in a range from 300 Å to 3000 Å.

9. The display substrate of claim 1, wherein a fluorine (F) concentration of the first wiring region is greater than a fluorine concentration of the first channel region.

10. The display substrate of claim 9, wherein the fluorine concentration of the first wiring region is more than twice the fluorine concentration of the first channel region.

11. The display substrate of claim 1, further comprising:
a second insulation layer disposed on the first active pattern; and
a first upper gate electrode disposed on the second insulation layer, the first upper gate electrode overlapping the first channel region.

12. The display substrate of claim 1, further comprising:
a second active pattern disposed on the substrate, the second active pattern not overlapping the first active pattern and including a second channel region and a second wiring region disposed on a side of the second channel region;
a second insulation layer disposed on the second active pattern; and
a second gate electrode disposed on the second insulation layer, the second gate electrode overlapping the second channel region.

13. The display substrate of claim 12, wherein the second active pattern is formed of polycrystalline silicon.

14. The display substrate of claim 12, further comprising:
a third insulation layer disposed on the second gate electrode; and
a capacitor electrode disposed on the third insulation layer, the capacitor electrode overlapping the second gate electrode.

15. The display substrate of claim 14, wherein the capacitor electrode is disposed on a same layer as the first lower gate electrode.

16. A display device, comprising:
a substrate;
a first transistor disposed on the substrate; and
a light-emitting element disposed on the first transistor,
wherein the first transistor includes:
a first lower gate electrode;
an insulation pattern disposed on and patterned to correspond to the first lower gate electrode, the insulation pattern including silicon nitride;
a first insulation layer disposed on the insulation pattern, the first insulation layer including silicon oxide; and
a first active pattern disposed on the first insulation layer and formed of oxide semiconductor, the first active pattern including a first channel region overlapping the first lower gate electrode and a first wiring region disposed on a side of the first channel region.

17. The display device of claim 16, further comprising:
a second transistor disposed between the substrate and the light-emitting element, the second transistor not overlapping the first transistor,
wherein the second transistor includes:
a second active pattern including a second channel region and a second wiring region disposed on a side of the second channel region;
a second insulation layer disposed on the second active pattern; and
a second gate electrode disposed on the second insulation layer, the second gate electrode overlapping the second channel region.

18. The display device of claim 17, wherein the second active pattern is formed of polycrystalline silicon.

19. The display device of claim 17, further comprising:
a capacitor disposed between the second transistor and the light-emitting element;
wherein the capacitor includes:
the second gate electrode;
a third insulation layer disposed on the second gate electrode; and
a capacitor electrode disposed on the third insulation layer, the capacitor electrode overlapping the second gate electrode.

20. The display device of claim 19, wherein the capacitor electrode is disposed on a same layer as the first lower gate electrode.

* * * * *